(12) United States Patent
Kikuchi et al.

(10) Patent No.: US 7,649,224 B2
(45) Date of Patent: Jan. 19, 2010

(54) DMOS WITH HIGH SOURCE-DRAIN BREAKDOWN VOLTAGE, SMALL ON-RESISTANCE, AND HIGH CURRENT DRIVING CAPACITY

(75) Inventors: Shuichi Kikuchi, Gunma (JP); Kiyofumi Nakaya, Saitama (JP); Shuji Tanaka, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 7 days.

(21) Appl. No.: 11/956,097

(22) Filed: Dec. 13, 2007

(65) Prior Publication Data

US 2009/0152627 A1  Jun. 18, 2009

(51) Int. Cl.
*H01L 23/62* (2006.01)

(52) U.S. Cl. .................. 257/342; 257/288; 257/335

(58) Field of Classification Search .................. 257/336, 257/344, 408, E29.012, E21.435, 335, 339, 257/342, 345, 356, 371, 409, E29.256, E29.257, 257/491

See application file for complete search history.

(56) References Cited

U.S. PATENT DOCUMENTS

| | | | |
|---|---|---|---|
| 5,091,336 A | 2/1992 | Beasom | |
| 5,146,298 A | 9/1992 | Eklund | |
| 5,191,401 A * | 3/1993 | Shirai et al. | 257/328 |
| 5,583,365 A * | 12/1996 | Villa et al. | 257/409 |
| 5,621,234 A * | 4/1997 | Kato | 257/339 |
| 5,798,552 A * | 8/1998 | Alavi et al. | 257/371 |
| 5,844,275 A * | 12/1998 | Kitamura et al. | 257/335 |
| 6,828,605 B2 * | 12/2004 | Eisele et al. | 257/213 |
| 6,864,533 B2 * | 3/2005 | Yasuhara et al. | 257/342 |
| 7,304,348 B2 * | 12/2007 | Ehwald et al. | 257/335 |
| 7,408,234 B2 * | 8/2008 | Ichijo et al. | 257/409 |
| 7,436,024 B2 * | 10/2008 | Kumagai et al. | 257/335 |

(Continued)

FOREIGN PATENT DOCUMENTS

JP  2004-039774  2/2004

OTHER PUBLICATIONS

European Search Report mailed Jun. 9, 2008 directed towards the counterpart foreign application No. 07024332.4; 3 pages.

*Primary Examiner*—Leonardo Andújar
*Assistant Examiner*—Teresa M Arroyo
(74) *Attorney, Agent, or Firm*—Morrison & Foerster LLP

(57) ABSTRACT

This invention is directed to offer a MOS transistor that has a high source-drain breakdown BVds, a low on resistance and a high electric current driving capacity. On resistance is lowered by forming an N well layer for lowering on resistance in the drift region. The N well layer is disposed beneath the gate electrode and away from the N well layer with a certain space between them. This space ensures the withstand voltage at the edge of the gate electrode of the drain layer side. Also, the N well layer is formed on the surface of an epitaxial layer in the region that includes a P+L layer. The edge of the N well layer of the drain layer side is located near the edge of the P+L layer of the drain layer side and away from the N well layer. This space makes the expansion of depletion layer from the P+L layer easier, further improving the withstand voltage.

8 Claims, 6 Drawing Sheets

Transistor A

U.S. PATENT DOCUMENTS

| | | | |
|---|---|---|---|
| 2004/0065919 A1* | 4/2004 | Wilson et al. | 257/329 |
| 2004/0262680 A1* | 12/2004 | Ehwald et al. | 257/335 |
| 2005/0062125 A1 | 3/2005 | Kitaguchi | |
| 2006/0145285 A1 | 7/2006 | Lee | |
| 2006/0197149 A1* | 9/2006 | Fujimoto | 257/335 |
| 2008/0038891 A1* | 2/2008 | Cho et al. | 438/275 |
| 2008/0067586 A1* | 3/2008 | Williams et al. | 257/335 |
| 2008/0067588 A1* | 3/2008 | Williams et al. | 257/343 |
| 2008/0251863 A1* | 10/2008 | Huang et al. | 257/409 |

* cited by examiner

Transistor A

FIG.2 Transistor B

Transistor C

FIG.4

| | Vt (V) | Ron (Ω) | Gm (S/μm) | Idsat (A/μm) | BVds (V) | BVdson (V) (Vg=10V) |
|---|---|---|---|---|---|---|
| Transistor D | 4.00 | 250000.00 | $6.1 \times 10^{-6}$ | $10.3 \times 10^{-5}$ | 322.50 | $\geq 280$ |
| Transistor B | 1.527 | 111532.50 | $1.215 \times 10^{-5}$ | $21.6 \times 10^{-5}$ | 248.80 | 300.00 |
| Transistor C | 1.53 | 111483.00 | $1.22 \times 10^{-5}$ | $21.6 \times 10^{-5}$ | 287.70 | 325.00 |

Transistor D

DMOS WITH HIGH SOURCE-DRAIN BREAKDOWN VOLTAGE, SMALL ON-RESISTANCE, AND HIGH CURRENT DRIVING CAPACITY

BACKGROUND OF THE INVENTION

1. Field of the Invention

This invention relates to a semiconductor device, especially to a DMOS (diffused MOS) type transistor.

2. Description of the Related Art

A DMOS type high withstand voltage MOS transistor has a high source-drain breakdown voltage or a high gate breakdown voltage. It has been broadly used in driver such as LCD driver as well as in power source circuit. Especially, a MOS transistor with a high source-drain breakdown voltage (BVds) and a low on resistance has been sought after in recent years.

FIG. 5 is a cross-sectional view showing the configuration of an N channel type high withstand voltage MOS transistor of prior arts. An N type epitaxial layer 101 is disposed on the surface of a P-type semiconductor substrate 100. An N+ type buried layer 102 is formed on the interface between the epitaxial layer 101 and the semiconductor substrate 100. A gate electrode 104 is formed on the epitaxial layer 101 with a gate insulation film 103 between them. A P-type body layer 105 (SP+D, P+D) is formed on the epitaxial layer 101 and an N+ type source layer 106 (NSD) is disposed on the surface of the body layer 105 adjacent to the gate electrode 104.

An N+ type N well layer 107 (N+W) is formed on the surface of the epitaxial layer 101, and an N+ type drain layer 108 (NSD) on the surface of N well layer 107. The region on the epitaxial layer 101 between the drain layer 108 and the body layer 105 is a drift region 109. A depletion layer expands in the drift region 109 and a P+L layer 110 made of P-type impurities is formed in the depletion layer in order to improve the strength against high voltage of the drain. The region on the surface of the body layer 105 between the drift region 109 and the source layer 106 is a channel region CH.

A first interlayer insulation film 111 is disposed on the surface of the semiconductor substrate 100. A first field plate 112 extending from above a part of the gate electrode 104 to above the P+L layer 110 is formed on the first interlayer insulation film 111. Also, a second interlayer insulation film 113 is disposed on the first interlayer insulation film 111. A second field plate 114 extending from above a part of the first field plate 112 to above the P+L layer 110 is formed on the second interlayer insulation film 113.

The first and second field plates 112, 114 are made of conduction material such as aluminum or poly-silicon. The electric potential of these plates are set as the same as that of the drain layer 106. The drain electric field is eased by the expansion of the depletion layer in the drift region 109, leading to the improved withstand voltage.

A P+ type potential fixation layer 115 (PSD, P+) for fixing the electric potential of the body layer 105 is formed right next to the source layer 106. A field insulation film 116 is disposed in a region extending from the P+L layer 110 to the drain layer 108 on the epitaxial layer 101 by using LOCOS methods. Also, a wiring layer 117 made of, for example, aluminum is formed over the source layer 106, the drain layer 108 and the potential fixation layer 115.

It is possible to acquire the high source-drain breakdown voltage BVds (for example 260-300 voltage) from the high withstand voltage MOS transistor with the configuration described. The high withstand voltage MOS transistor of prior arts is called a transistor D, hereinafter, for the sake of convenience.

The related technologies are published in Japanese Patent Application Publication No. 2004-039774.

Although it is possible to acquire the high withstand voltage MOS transistor of prior arts (transistor D), a MOS transistor with smaller on resistance and higher current driving capacity has been sought after.

SUMMARY OF THE INVENTION

This invention is directed to a MOS transistor not only with a high source-drain breakdown voltage BVds, but also with a smaller on resistance and higher current driving capacity.

The characteristic of this invention is as follows; the semiconductor device of this invention has a body layer of a second conductivity type including a channel region formed on the surface of a semiconductor layer of a first conductivity type, a source layer of the first conductivity type formed on the surface of the body layer, a gate electrode formed on a part of the body layer with a gate insulation film between them, a first well layer of the first conductivity type formed on the surface of the semiconductor layer, and a drain layer of the first conductivity type formed on the surface of the first well layer. The semiconductor device of this invention also has a first withstand voltage boosting layer of the second conductivity type for boosting the withstand voltage formed on an epitaxial layer in a drift region extending from the drain layer to the body layer, a second well layer of the first conductivity type for lowering on resistance formed on the surface of the semiconductor layer in the region including the lower part of the gate electrode, and a third well layer for lowering on resistance formed in the region separate from the second well layer and separate from the neighboring area of the edge of the gate electrode of the drain layer side in the drift region. The second conductivity type in this context means the opposite conductivity type from the first conduction type.

BRIEF DESCRIPTION OF THE DRAWINGS

FIG. 4 is a table explaining the characteristics of this invention.

DETAILED DESCRIPTION OF THE INVENTION

Figure 1:
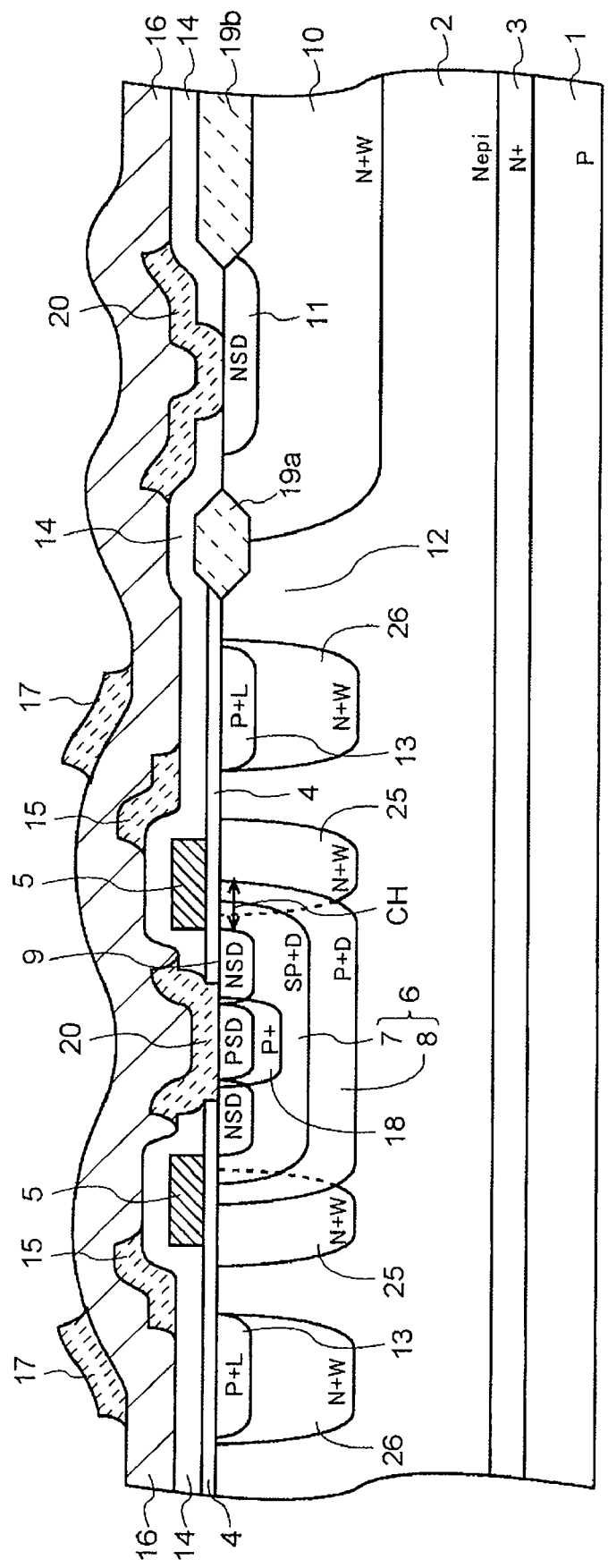
FIG. 1 is a cross-sectional view of the first embodiment of the semiconductor device of this invention.

The reference example of the high withstand voltage MOS transistor shown in FIG. 6 will be explained before the explanation of the embodiment of this invention is made. In the reference example shown in FIG. 6, the current driving capacity is improved by lowering the resistance of the drift region 109 of the high withstand voltage MOS transistor, transistor D shown FIG. 5. The same reference numerals will be given to the same components as those in transistor D and the explanation on these will be omitted.

An N well layer 120 (N+W) that has an impurity higher than the epitaxial layer 101 is thoroughly disposed extending from beneath the gate electrode 104 toward the drain layer 108 in order to lower the resistance R of the drift region 109 in the high withstand voltage MOS transistor of the reference example.

The concentration of N type impurities in the drift region 109 is higher in the DMOS configuration compare to the high withstand voltage MOS transistor (transistor D). Therefore, the resistance R of the drift region is lowered, leading to the lower on resistance. However, it is not possible to maintain the drain strength against high voltage with this configuration. That is, breakdown occurs due to the concentration of electric field at the region X, beneath the one end of the gate electrode 104 located at the drain layer 108 side, and at the region Y, which is located around one end of the P+L layer located at the drain layer side, as shown in FIG. 6, preventing to obtain the desirable strength against high voltage (for example, 230-300 volts).

A reliable high withstand voltage MOS transistor, in which high withstand voltage can be acquired while on resistance is still kept low, is formed in a first embodiment of this invention. The details will be explained below by referring to FIG. 1

An N type epitaxial layer 2 is disposed on the surface of a P-type semiconductor substrate 1 and an N+ type buried layer 3 is formed on the interface between the epitaxial layer 2 and the bottom part of the semiconductor substrate 1 in this embodiment of the high withstand voltage MOS transistor. The epitaxial layer 2 and the buried layer 3 are formed by densely doping N type impurities and allowing the epitaxial growth on the surface of the semiconductor substrate 1.

A gate electrode 5 is formed on the pre-determined area on the epitaxial layer 2 with a gate insulation film between them. A P-type body layer 6 (SP+D, P+D) that includes a channel region CH is formed on the epitaxial layer 2. The body layer 6 has a double layered configuration; a P-type SP+D layer 7 and a P-type P+D layer 8 with a lower concentration and a deeper diffusion than the SP+D layer 7. In this double layered configuration, the P+D layer 8 with lower concentration contributes to the strength against high voltage while the SP+D layer 7 with higher concentration functions to adjust the threshold value, preventing the punch through phenomena.

It is noted that conductivity types such as P+, P and P− belong in a general conductivity type, and conductivity types such as N+, N and N− belong in another general conductivity type.

The P+D layer 8 can be formed by performing ion doping of boron ion with the accelerated voltage of 50 KeV and the doping amount of $2 \times 10^{13}/cm^2$ and then performing a thermal processing. Also, SP+D layer 7 can be acquired by performing ion doping of boron ion with the accelerated voltage of 50 KeV and the doping amount of $2 \times 10^{14}/cm^2$ and then performing a thermal processing.

An N+ type source layer 9 (NSD) is formed on the body layer 6 adjacent to the gate electrode 5. The N+ type N well layer 10 (N+W) with concentration higher than the epitaxial layer 2 is formed on the surface of the epitaxial layer 2. The N+ type drain layer 11 (NSD) with a concentration further higher than the N well layer 10 is disposed on the N well layer 10.

The source layer 9 and the drain layer 11 can be formed by performing ion doping of phosphate ion with the accelerated voltage of 100 KeV and the doping amount of $5.2 \times 10^{15}/cm^2$ and then performing a thermal processing. Also, the N well layer 10 can be formed by performing ion doping of phosphate ion with the accelerated voltage of 80 KeV and the doping amount of $2 \times 10^{12}/cm^2$ and then performing a thermal processing.

The surface region of the epitaxial layer 2 between the drain layer 11 and the body layer 6 is a drift region 12. A P+L layer 13 made from P-type impurities is formed as a first withstand voltage boosting layer in the drift region 12 by expanding the depletion layer, in order to boost the drain breakdown voltage. The P+L layer 13 can be formed by performing ion doping of boron ion with the accelerated voltage of 50 KeV and the doping amount of $2.5 \times 10^{12}/cm^2$ and then performing a thermal processing. The region on the surface of the body layer 6 in the drift region between the source layer 9 and the epitaxial layer 2 is a channel region CH.

A first interlayer insulation film 14 is disposed on the surface of the semiconductor substrate 1 and a first field plate 15 extending from a part of the gate electrode 5 to the P+L layer 13 is formed on the first interlayer insulation film 14. Also, a second interlayer insulation film 16 is disposed on the first interlayer insulation film 14. A second field plate 17 that extends over the second interlayer insulation film 16 from a part of the first field plate 15 to the edge of the P+L layer 13 of the drain layer side is also formed.

The first and second interlayer insulation films 14 and 16 are a silicon oxide film or a silicon nitride film formed through CVD methods and their thickness of the film is about, for example, 1000 Å. The first and second field plates 15 and 17 are made from a conduction material such as aluminum, aluminum alloy or poly-silicon. The potential of the first and second field plates 15 and 17 is set to the same voltage as that of the source layer 9. The first and second field plates 15 and 17 function to ease the drain electric field by expanding the depletion layer in the drift region 12 and boost the strength against high voltage.

A voltage fixation layer 18 (PSD, P+), which is formed for fixing the voltage, made from P-type impurities is formed adjacent to the source layer 9 on the surface of the body layer 6. The PSD layer can be formed by performing ion doping of boron ion with the accelerated voltage of 50 KeV and the doping amount of $1.3 \times 10^{15}/cm^2$ and then performing a thermal processing. The P+ layer is formed by performing ion doping of boron ion with the accelerated voltage of 50 KeV and the doping amount of $2 \times 10^{14}/cm^2$ and then performing a thermal processing.

It is preferable to form field insulation films 19a and 19b on the epitaxial layer 2 in the region extending over from the P+L layer 13 to the drain layer 11 as well as over a part of the N well layer 10 for boosting the withstand voltage. The field insulation films 19a and 19b are formed though well-known LOCOS method. The P+L layer 13 shows a better performance when it is formed with a certain distance, for example 2-3 μm, from the field insulation film 19a compared to the case when it is formed right next to the field insulation film 19a. Therefore, it is preferable to keep a certain distance between the P+L layer 13 and the field insulation film 19a.

A wiring layer 20 made from, for example, aluminum is disposed on the source layer 9, the voltage fixation layer 18 and the drain layer 11. And an N well layer 25 (N+W) for lowering the resistance of the drift region 12 and the on resistance of the MOS transistor is formed beneath the gate electrode 5. The edge of the N well layer 25 at the source layer 9 side is superimposed on the body layer 6 beneath the gate electrode 5, and the other edge of the N well layer 25 at the drain layer 11 side is located at the neighboring area below the edge of the gate electrode of the drain layer 11 side.

An N well layer 26, also for lowering the on resistance is formed at the region including the P+L layer 13 on the surface of the epitaxial layer 2. The edge of the N well layer 26 of the drain layer 11 side is located at the neighboring area of the edge of the P+L layer 13 of the drain layer 11 side.

The N well layer 25 and the N well layer 26 are formed with a certain distance between them (for example, 10 μm) as shown in FIG. 1. That is, the concentration of the N-well layer 25 is lowered in the region on the epitaxial layer 2 beneath the one edge of the gate electrode 5 of the drain layer 11 side (where breakdown due to the concentration of electric field easily occurs in the configuration shown in the reference example of FIG. 6). The distance between the N well layers eases the concentration of electric field in this region compared to the configuration of the reference example shown in FIG. 6.

Figure 6:
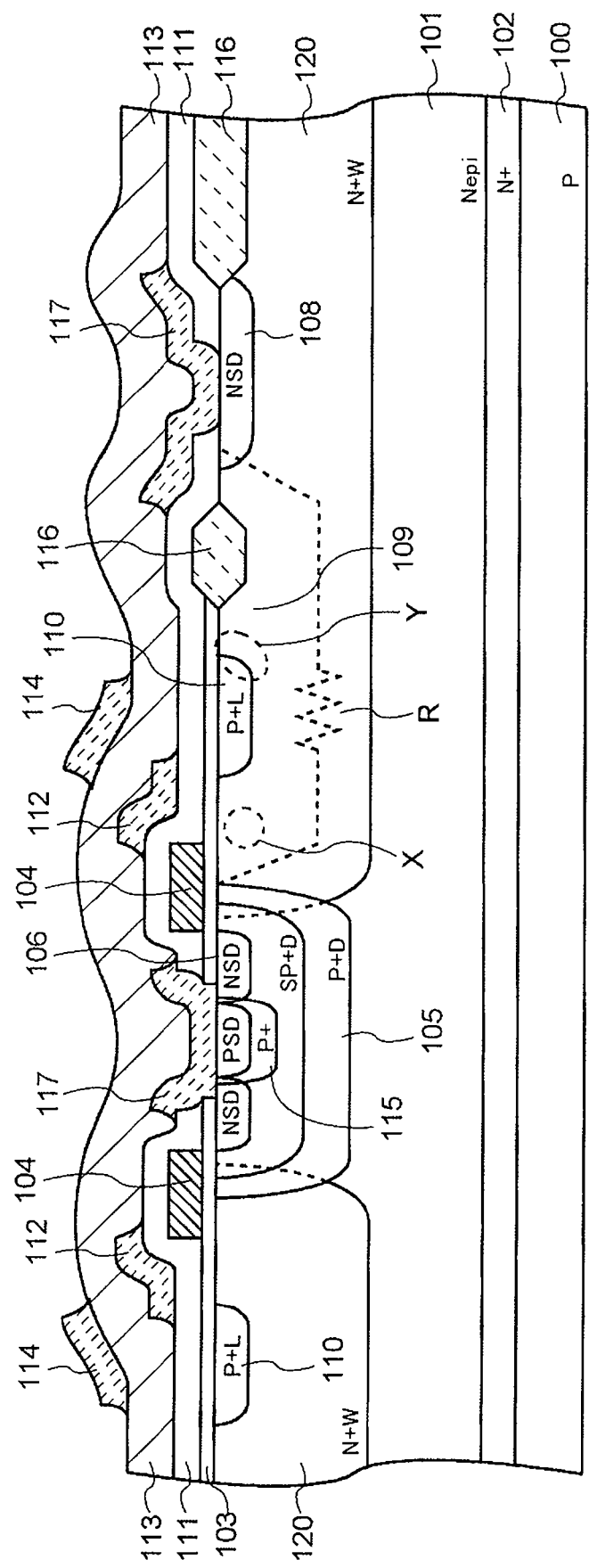
FIG. 6 is a cross-sectional view of the semiconductor device of a reference example.

The concentration of the N well layer 26 is lowered in the certain region extending from the P+L layer 13 to the drain layer 11 (where breakdown due to the concentration of electric field easily occurs in the configuration shown in the reference example of FIG. 6) keeping the distance of, for example, about 10 μm, between the P+L layer 13 (and the N well layer 26) and the N well layer 10. This space allows for the depletion layer to expand from the P+L layer 13 to the drain layer 11 side, easing the concentration of electric field in this region.

The layers for lowering on resistance are not formed thoroughly but they are formed in a certain regions in this embodiment as described above. They are formed in this way in order to prevent the destruction due to the breakdown that occurs with concentration of electric field and to improve the strength against high voltage.

These N well layers 25 and 26 for lowering on resistance can be formed through the same processing as that for the N well layer 10. For example, they are formed by performing ion doping of phosphate ion with the accelerated voltage of 80 KeV and the doping amount of $2 \times 10^{12}/\text{cm}^2$ and then performing a thermal processing.

The high withstand voltage MOS transistor described above is referred to as a transistor A for the sake of convenience. In this configuration, the resistance in the drift region is lowered because of the presence of the N well layers 25 and 16 in the drift region. The N well layers 25 or 26 are not formed in the area, where the destruction due to concentration of electric field is likely to occur, in the drift region. Therefore, it is possible to acquire the MOS transistor with high source-drain breakdown voltage (BVds) and at the same time, with a high electric current performance because of the low on resistance.

Figure 2:
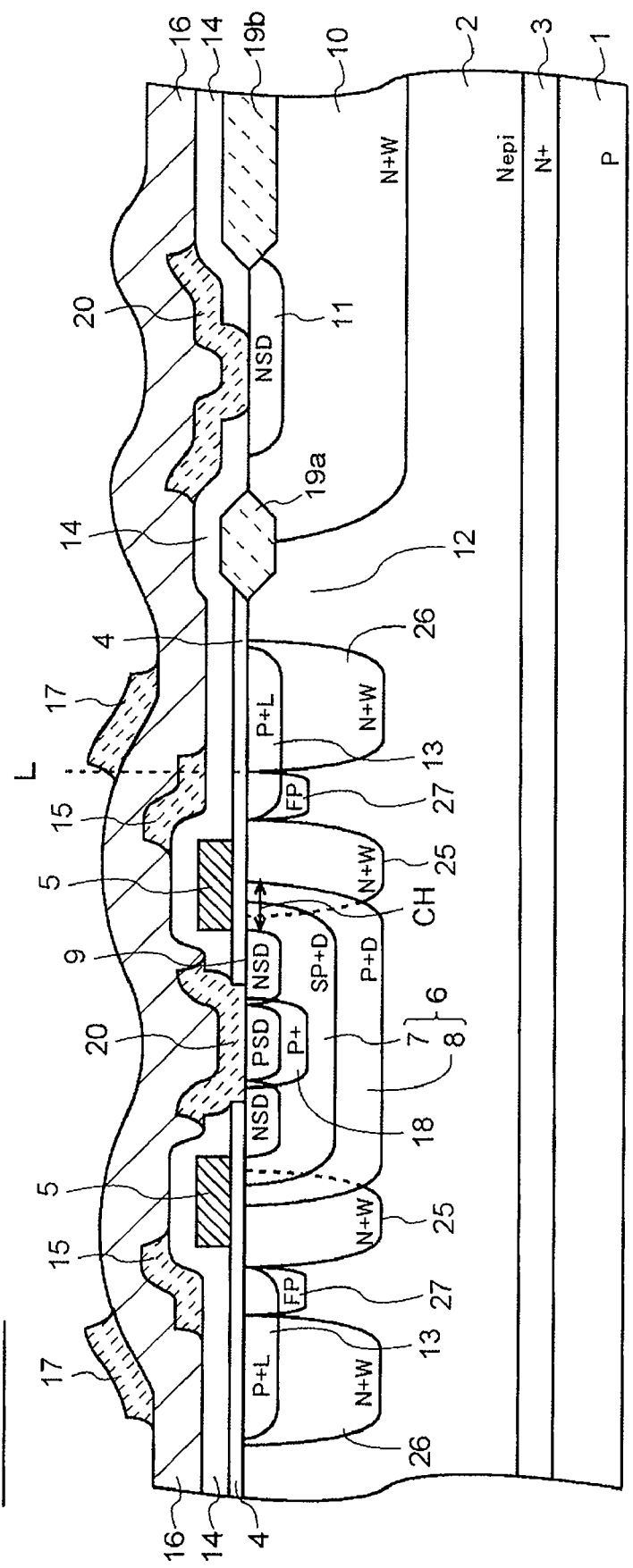
FIG. 2 is a cross-sectional view of the first embodiment of the semiconductor device of this invention.

Since the N well layer 25 is formed beneath the gate electrode 5 in the configuration described above (transistor A), the depletion layer does not easily expand beneath the gate electrode 5 compared to the case without the N well layer 25. Therefore, it is preferable to locate the edge of the P+L layer 13 at the source layer 9 side right next to the edge of the gate electrode 5 of the drain layer 11 side, as shown in FIG. 2, by making the expansion of the depletion layer easier in the area beneath the gate electrode 5 compared to the case of transistor A for improving the strength against high voltage. Since the on resistance will increase a little compared to the case of transistor A, it is preferable to locate the edge of the P+L layer 13 of the source layer 9 side separate from the gate electrode 5 for decreasing the on resistance.

Also, it is preferable to form an FP layer 27, as a second withstand voltage boosting layer, made from P-type impurities with the concentration higher than that of the P+L layer 13 in a certain region (in FIG. 2, in the region between the N well layer 25 and the N well layer 26) starting from the edge of the gate electrode 5 at the drain layer 11 side as shown in FIG. 2, for further improving the strength against high voltage. It is possible to form the desirable high withstand voltage by forming the FP layer 27 as described in this section. The FP layer 27 is formed by performing ion doping of boron ion with the accelerated voltage of 50 KeV and the doping amount of $1.5 \times 10^{13}/\text{cm}^2$ and then performing a thermal processing.

Although the edge of the FP layer 27 at the drain layer 11 side and the edge of the N well layer 26 at the source layer 9 side are located right next to each other in FIG. 2, it is also possible to change the location according the design. That is, the FP layer 27 can be formed with or without being superimposed with the N well layer 26.

When the FP layer 27 is formed, it is preferable to locate the edge of the first field plate 15 of the drain layer 11 side nearer to the drain layer 11 than the dotted line L (the edge of the FP layer 27 at the drain layer 11 side) in FIG. 2 or to locate it to the source layer 9 side. If the edge of the first field plate 15 aligns with the line extending from the edge of the FP layer 27, the concentration of electric field is likely to occur. Therefore, it is preferable to locate the edge of the first field plate 15 of the drain layer 11 side nearer to the drain layer 11 than the dotted line L for easing the electric field as well as improving the strength against high voltage.

The configuration, where the edge of the P+L layer 13 of the source layer 9 side is located at the edge of the gate electrode 5 of the drain layer 11 side, and where the FP layer 27 is further formed, is referred to as a transistor B hereinafter for the sake of convenience.

Figure 5:
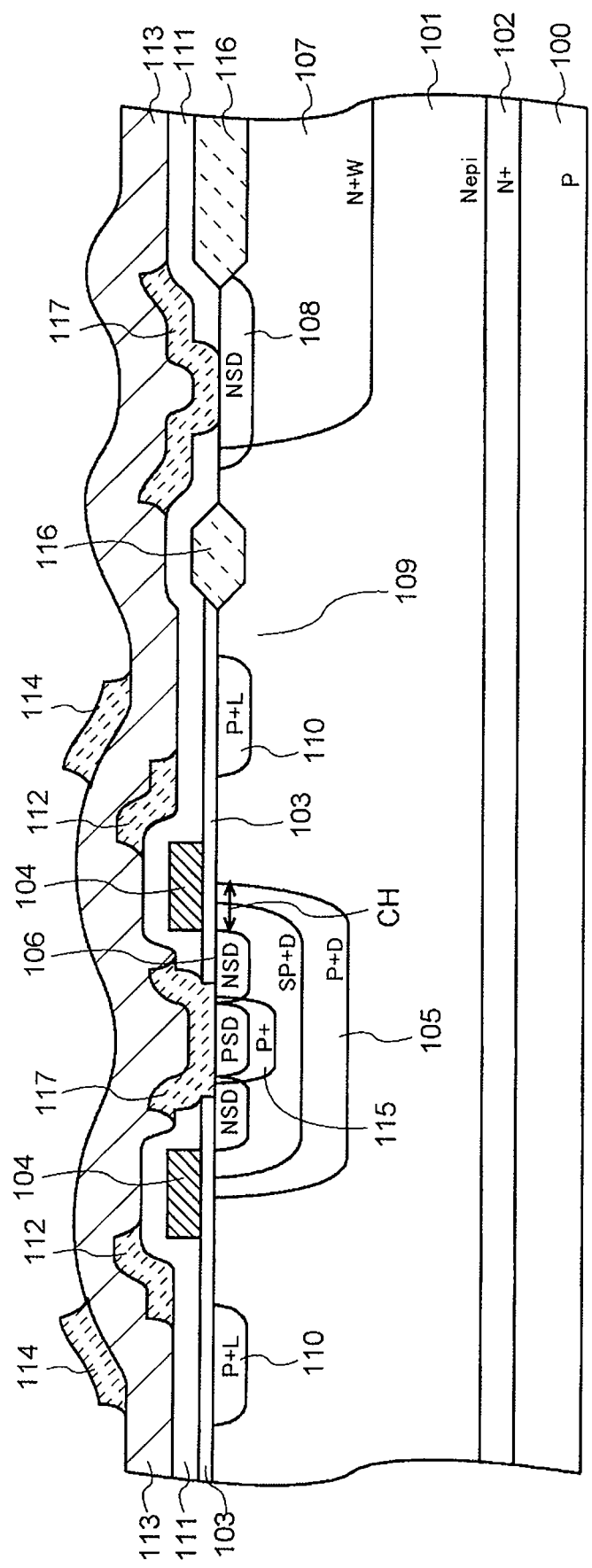
FIG. 5 is a cross-sectional view explaining the semiconductor device of prior arts.

The operation characteristics of the high withstand voltage MOS transistor (transistor D), shown in FIG. 5, are compared to that of the high withstand voltage MOS transistor shown in FIG. 2 (transistor B). FIG. 4 shows the following properties of the each of the MOS transistor; threshold voltage (Vt), on resistance (Ron), transconductance (Gm), saturated electric current (Idsat), the source-drain breakdown voltage (BVds) when the gate voltage, the source voltage, and the substrate voltage are 0V, and the source and the drain strength against high voltage (BVdson) when the source voltage and the substrate voltage are 0V and the gate voltage Vg is 10V.

As seen from the figure, the on resistance (Ron) of the transistor B decreases to about ½, while the transconductance (Gm) and the saturated electric current (Idsat) increase about twofold, showing the improvement of the current driving capacity. Although the breakdown voltage (BVds) while the device is off is smaller compared to that of transistor D, this transistor has enough strength against high voltage. The breakdown voltage (BVds) while the device is on of this transistor is higher than that of the configuration (transistor D).

Figure 3:
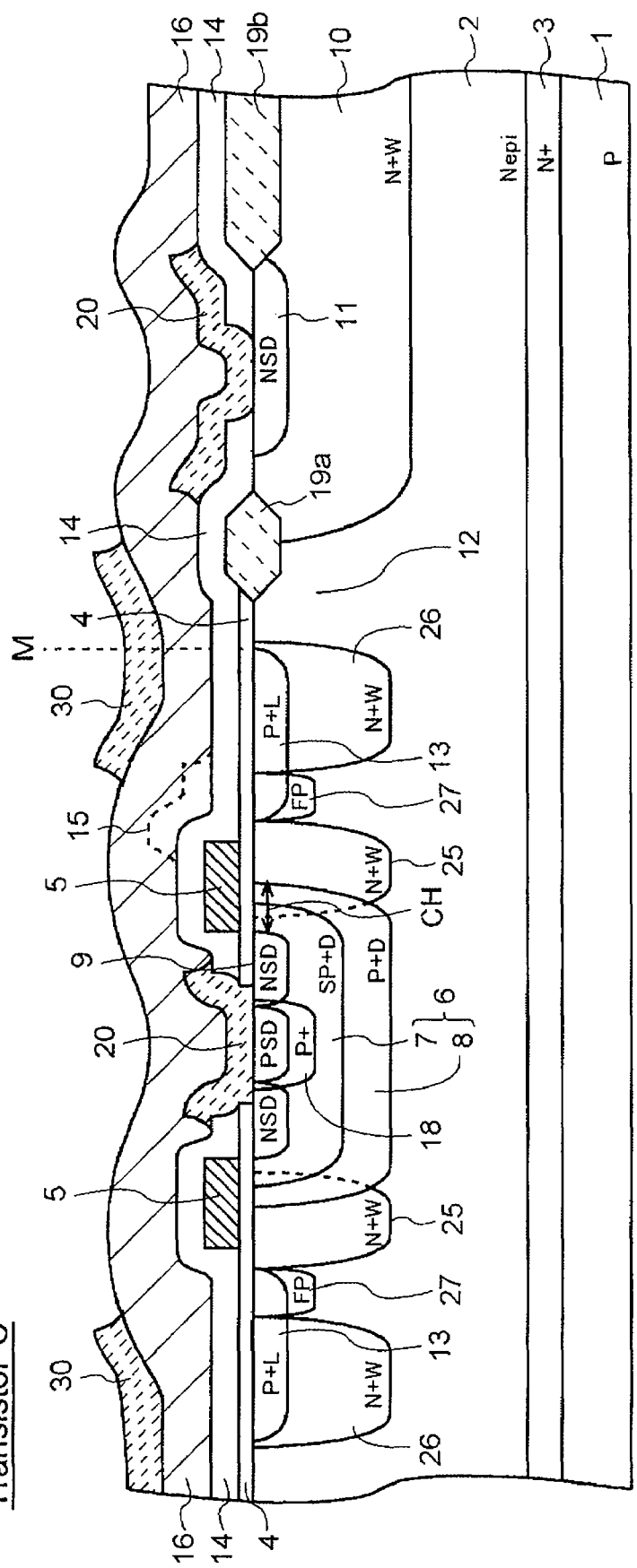
FIG. 3 is a cross-sectional view of the second embodiment of the semiconductor device of this invention.

A second embodiment of this invention will be explained by referring to FIG. 3. The same numerical references are given to the same components as those in the first embodiment. The explanation on those configurations will be either omitted or simplified.

The edge of the second field plate 17 of the drain layer 11 side is located above the P+L layer 13 in the first embodiment. Compared to this arrangement, the edge extends towards the drain layer 11 side over the dotted line M (the edge of the P+L layer 13 of the drain layer 11 side) in the second embodiment, as shown in FIG. 3. This is referred to as a second field plate 30.

The depletion layer of the P+L layer 13 expands more easily towards the drain layer 11 side compared to the case where the edge of the second field plate 30 locates closer to the source layer 9 than the dotted line M, leading to the improved withstand voltage.

Furthermore, it is preferable to form the second field plate 30 in such way that the edge of the second field plate 30 locates above a part of the field insulation film 19a. If the edge of the second field plate 30 aligns with the edge of the P+L layer 13, the concentration of the electric field is likely to take place.

The first field plate 15 is not formed in the second embodiment, while it is formed in the first embodiment. The properties of the MOS transistor are improved when the first field plate is not formed compared to the case where the first field plate is formed.

The MOS transistor of the second embodiment that has the second field plate 30 but does not have the first field plate is referred to as a transistor C. However, the second embodiment does not exclude the formation of the first field plate 15. Therefore, it is possible to have the first field plate 15 as in the first embodiment (transistor B), as shown as the doted line in FIG. 3.

FIG. 4 shows the operation properties of the transistor C. As seen from the figure, the on resistance (Ron) of the transistor C decreases to about ½, while the transconductance (Gm) and the saturated electric current (Idsat) increase about twofold, compared to those in the configuration of prior arts (transistor D), showing the improvement of the current driving capacity. Although the strength against high voltage (BVds) while the device is off is smaller compared to that of the configuration of prior arts, this transistor has enough withstand voltage. The breakdown voltage (BVds) while the device is on of this transistor is higher than that of the configuration (transistor D) of prior arts.

As explained above, the N well layers 25, 26 are formed in the drift region for lowering on resistance in both first and second embodiments. Also, the N well layers 25, 26 are not formed in the region where the concentration of electric field is likely to occur and therefore to give a negative effect to the withstand voltage. They are disposed only in the region where they are needed, preventing the decreased the withstand voltage as a whole. Additionally, the decrease of the withstand voltage can be further prevented by forming the P+L layer adjacent to the gate electrode and forming the FP layer made of P-type impurities with the concentration higher than that of P+L layer. Therefore, the MOS transistor with the source and the source-drain breakdown voltage BVds as well as with the lower on resistance and high electric currency driving capacity is acquired.

Needless to say, this invention is not limited to the embodiments described above. It is possible to change the design within the scope of this invention. For example, the field insulation film 19a is formed in the above embodiments, it is also possible to omit the formation of the field insulation film 19a. Although the explanation on a P channel type DMOS transistor is omitted here, it is well known that it has the same configuration with different conduction type. This invention can be applied to the configuration where the DMOS transistor of this invention is combined with the other semiconductor device.

The layer for lowering on resistance is formed in a certain area within the drift region in this invention. However, within the drift region where a negative effect to the withstand voltage is likely to take place, the layer for lowering on resistance is not formed. Therefore, the MOS transistor with the high source-drain breakdown voltage and with the lower on resistance can be acquired.

What is claimed is:

1. A semiconductor device comprising:
   a semiconductor layer of a first general conductivity type;
   a body layer of a second general conductivity type formed in the semiconductor layer and comprising a channel region;
   a source layer formed in the body layer;
   a gate electrode disposed on the body layer;
   a first well layer of the first general conductivity type formed in the semiconductor layer;
   a drain layer of the first general conductivity type formed in the first well layer;
   a first withstand voltage boosting layer of the second general conductivity type configured to improve a withstand voltage of the semiconductor device, the first boosting layer being formed in a portion of the semiconductor layer operating as a drift region extending from the drain layer to the body layer;
   a second well layer of the first general conductivity type configured to lower an on-resistance and formed in the semiconductor layer under the gate electrode; and
   a third well layer of the first general conductivity type configured to lower the on-resistance and formed in the drift region so that the second and third well layers are physically separated from each other.

2. The semiconductor device of claim 1, wherein the third well layer is physically separated from the first well layer.

3. The semiconductor device of claim 1, wherein the first withstand voltage boosting layer is physically in contact with the second well layer.

4. The semiconductor device of claim 1, further comprising a second withstand voltage boosting layer configured to improve the withstand voltage and having an impurity concentration higher than the first boosting layer that is formed in the semiconductor layer between the second well layer and the third well layer.

5. The semiconductor device of claim 1, further comprising a field plate disposed on the first withstand voltage boosting layer, wherein an edge of the field plate extends beyond an edge of the third well layer toward the drain layer.

6. The semiconductor device of claim 1, wherein the third well layer and the first withstand voltage boosting layer are superimposed.

7. The semiconductor device of claim 1, further comprising a field insulation film formed in the semiconductor layer between the drain layer and the third well layer, wherein the first withstand voltage boosting layer and the third well layer are physically separated from the field insulation film.

8. The semiconductor device of claim 7, further comprising a field plate disposed on the first withstand voltage boosting layer and extending toward the drain layer so as to cover at least part of the field insulation film.

* * * * *